(12) United States Patent
Xu et al.

(10) Patent No.: US 9,564,341 B1
(45) Date of Patent: Feb. 7, 2017

(54) GAS-PHASE SILICON OXIDE SELECTIVE ETCH

(71) Applicant: Applied Materials, Inc., Santa Clara, CA (US)

(72) Inventors: Jingjing Xu, Cupertino, CA (US); Anchuan Wang, San Jose, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/818,165

(22) Filed: Aug. 4, 2015

(51) Int. Cl.
*H01L 21/302* (2006.01)
*H01L 21/461* (2006.01)
*H01L 21/311* (2006.01)

(52) U.S. Cl.
CPC ................ *H01L 21/31116* (2013.01)

(58) Field of Classification Search
CPC .................................................. H01L 21/31116
USPC ...................................................... 438/738
See application file for complete search history.

(56) References Cited

U.S. PATENT DOCUMENTS

| | | | |
|---|---|---|---|
| 7,416,989 B1 * | 8/2008 | Liu | H01L 21/02063 438/706 |
| 2004/0110354 A1 | 6/2004 | Natzle et al. | |
| 2005/0230350 A1 | 10/2005 | Kao et al. | |
| 2008/0182382 A1 | 7/2008 | Ingle et al. | |
| 2009/0104782 A1 | 4/2009 | Lu et al. | |
| 2010/0018463 A1 * | 1/2010 | Yu | C23C 16/301 118/715 |
| 2011/0053380 A1 | 3/2011 | Sapre et al. | |
| 2011/0151674 A1 | 6/2011 | Tang et al. | |
| 2011/0230052 A1 | 9/2011 | Tang et al. | |
| 2011/0266252 A1 | 11/2011 | Thadani et al. | |
| 2012/0196447 A1 | 8/2012 | Yang et al. | |
| 2012/0211462 A1 | 8/2012 | Zhang et al. | |
| 2014/0080309 A1 | 3/2014 | Park et al. | |
| 2014/0308818 A1 | 10/2014 | Wang et al. | |
| 2015/0187593 A1 * | 7/2015 | Narushima | H01L 21/6708 438/735 |
| 2015/0249018 A1 | 9/2015 | Park et al. | |

* cited by examiner

*Primary Examiner* — Roberts Culbert
(74) *Attorney, Agent, or Firm* — Kilpatrick Townsend & Stockton LLP

(57) ABSTRACT

A method of etching silicon oxide on patterned heterogeneous structures is described and includes a gas phase etch using anhydrous vapor-phase HF. The HF is combined with an additional precursor in the substrate processing region. The HF may enter through one channel(s) and the additional precursor may flow through another channel(s) prior to forming the combination. The combination may be formed near the substrate. The silicon oxide etch selectivity relative to silicon nitride from is selectable from about one to several hundred. In all cases, the etch rate of exposed silicon, if present, is negligible. No precursors are excited in any plasma either outside or inside the substrate processing region according to embodiments. The additional precursor may be a nitrogen-and-hydrogen-containing precursor such as ammonia.

15 Claims, 6 Drawing Sheets

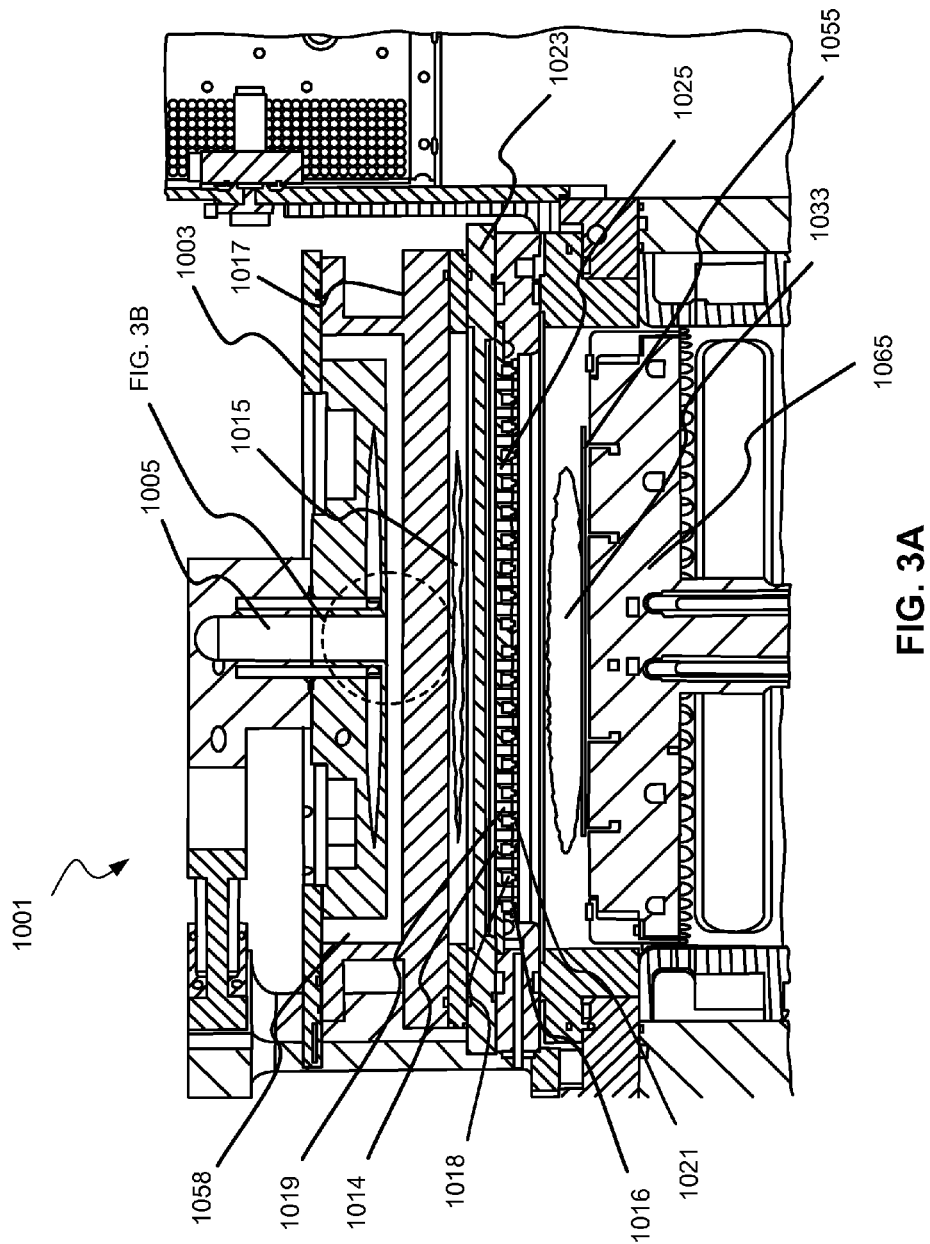

GAS-PHASE SILICON OXIDE SELECTIVE ETCH

FIELD

Embodiments described herein relate to selectively removing silicon oxide.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which removes one material faster than another helping e.g. a pattern transfer process proceed. Such an etch process is said to be selective to the first material. As a result of the diversity of materials, circuits and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. For example, remote plasma excitation of ammonia and nitrogen trifluoride enables silicon oxide to be selectively removed from a patterned substrate when the plasma effluents are flowed into the substrate processing region. Other remote plasma etch processes have also been developed to remove silicon oxide, however, the silicon oxide selectivity of these etch processes (relative to silicon nitride) can still benefit from additional flexibility.

Methods are needed to enable greater tenability of silicon oxide etch selectivity relative to silicon nitride and silicon for dry etch processes.

SUMMARY

A method of etching silicon oxide on patterned heterogeneous structures is described and includes a gas phase etch using anhydrous vapor-phase HF. The HF is combined with an additional precursor in the substrate processing region. The HF may enter through one channel and the additional precursor may flow through another channel prior to forming the combination. The combination may be formed near the substrate. The silicon oxide etch selectivity relative to silicon nitride from is selectable from about one to several hundred. In all cases, the etch rate of exposed silicon, if present, is negligible. No precursors are excited in any plasma either outside or inside the substrate processing region according to embodiments. The HF may be flowed through one set of channels in a dual-channel showerhead while the additional precursor is flowed through a second set of channels in the dual-channel showerhead. The additional precursor may be a nitrogen-and-hydrogen-containing precursor such as ammonia.

Embodiments described herein include methods of etching a patterned substrate. The methods include placing the patterned substrate in a substrate processing region of a substrate processing chamber. The patterned substrate has an exposed silicon oxide portion and an exposed silicon nitride portion. The methods further include flowing anhydrous hydrogen fluoride into the substrate processing region. The methods further include flowing a nitrogen-and-hydrogen-containing precursor into the substrate processing region. The methods further include combining the anhydrous hydrogen fluoride with the nitrogen-and-hydrogen-containing precursor within the substrate processing region. The methods further include dry etching the exposed silicon oxide portion. A selectivity of the dry etching operation (exposed silicon oxide:exposed silicon nitride) is selectable throughout the range from 1:1 through 250:1.

The exposed silicon nitride portion may consist or consist essentially of silicon and nitrogen. The exposed silicon oxide portion may consist or consist essentially of silicon and oxygen. The patterned substrate may further include an exposed silicon portion of one of single-crystal silicon, polysilicon or amorphous silicon. The exposed silicon oxide portion may be removed at a silicon oxide etch rate which is greater than a silicon nitride etch rate at which the exposed silicon nitride portion is removed. The substrate processing region may be plasma-free during the operation of dry-etching the exposed silicon oxide portion. The anhydrous hydrogen fluoride is not excited in any plasma prior to entering the substrate processing region in embodiments.

Embodiments described herein include methods of etching a patterned substrate. The methods include placing the patterned substrate in a substrate processing region of a substrate processing chamber. The patterned substrate has exposed silicon oxide and at least one of exposed silicon and exposed silicon nitride. The methods further include flowing HF vapor into a remote region fluidly coupled to the substrate processing region through a dual-channel showerhead. The HF vapor flows from the remote region to the substrate processing region through a first channel including through-holes through the dual-channel showerhead. The methods further include flowing a nitrogen-and-hydrogen-containing precursor into the substrate processing region through a second channel having holes which open into the substrate processing region but not directly into the remote region. The methods further include combining the HF vapor with the nitrogen-and-hydrogen-containing precursor in the substrate processing region. The methods further include etching the exposed silicon oxide more rapidly than the one of exposed silicon or exposed silicon nitride.

A selectivity of the operation (exposed silicon oxide:one of exposed silicon or exposed silicon nitride) may be greater than or about 75:1. Neither the HF vapor nor the nitrogen-and-hydrogen-containing precursor may flow through any plasma prior to entering the substrate processing region in some embodiments. The nitrogen-and-hydrogen-containing precursor may include one of $N_2H_2$, $NH_3$, or $N_2H_4$. The nitrogen-and-hydrogen-containing precursor may consist only of nitrogen and hydrogen. A temperature of the patterned substrate may be between 40° C. and about 200° C. during the operation of etching the exposed silicon oxide.

Embodiments described herein include methods of etching a patterned substrate. The methods include placing the patterned substrate in a substrate processing region of a substrate processing chamber. The patterned substrate has an exposed silicon oxide portion and an exposed silicon portion. The methods further include flowing anhydrous HF into the substrate processing region. The methods further include flowing $NH_3$ into the substrate processing region without first passing the $NH_3$ through any plasma. The methods further include combining the anhydrous HF and the NH₃ in the substrate processing region, and etching the exposed silicon oxide portion. The substrate processing region is plasma-free during the operation of etching the exposed silicon oxide portion. The substrate processing region is plasma-free during the operation of etching the exposed silicon oxide portion. A temperature of the patterned substrate is below 100° C. during the operation of etching the exposed silicon oxide portion. The methods further comprise heating the patterned substrate above 100° C. to remove etch by-products. The patterned substrate is not removed from the substrate processing region between the operations of etching the exposed silicon oxide portion and heating the patterned substrate. A pressure in the substrate processing region may be between 0.1 Torr and 1000 Torr during the operation of etching the exposed silicon oxide portion.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the disclosed technology may be realized by reference to the remaining portions of the specification and the drawings.

FIG. 3A shows a schematic cross-sectional view of a substrate processing chamber according to embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

A method of etching silicon oxide on patterned heterogeneous structures is described and includes a gas phase etch using anhydrous vapor-phase HF. The HF is combined with an additional precursor in the substrate processing region. The HF may enter through one channel and the additional precursor may flow through another channel prior to forming the combination. The combination may be formed near the substrate. The silicon oxide etch selectivity relative to silicon nitride is selectable from about one to several hundred. In all cases, the etch rate of exposed silicon, if present, is negligible. No precursors are excited in any plasma either outside or inside the substrate processing region according to embodiments. The HF may be flowed through one set of channels in a dual-channel showerhead while the additional precursor is flowed through a second set of channels in the dual-channel showerhead. The additional precursor may be a nitrogen-and-hydrogen-containing precursor such as ammonia.

Selective remote gas phase etch processes have been developed to remove silicon oxide relative to silicon nitride with an adjustable selectivity. The methods presented herein provide methods which do not rely on a remote plasma (or a local plasma). Some applications will benefit from the availability of a non-plasma option for removing silicon oxide.

Figure 1:
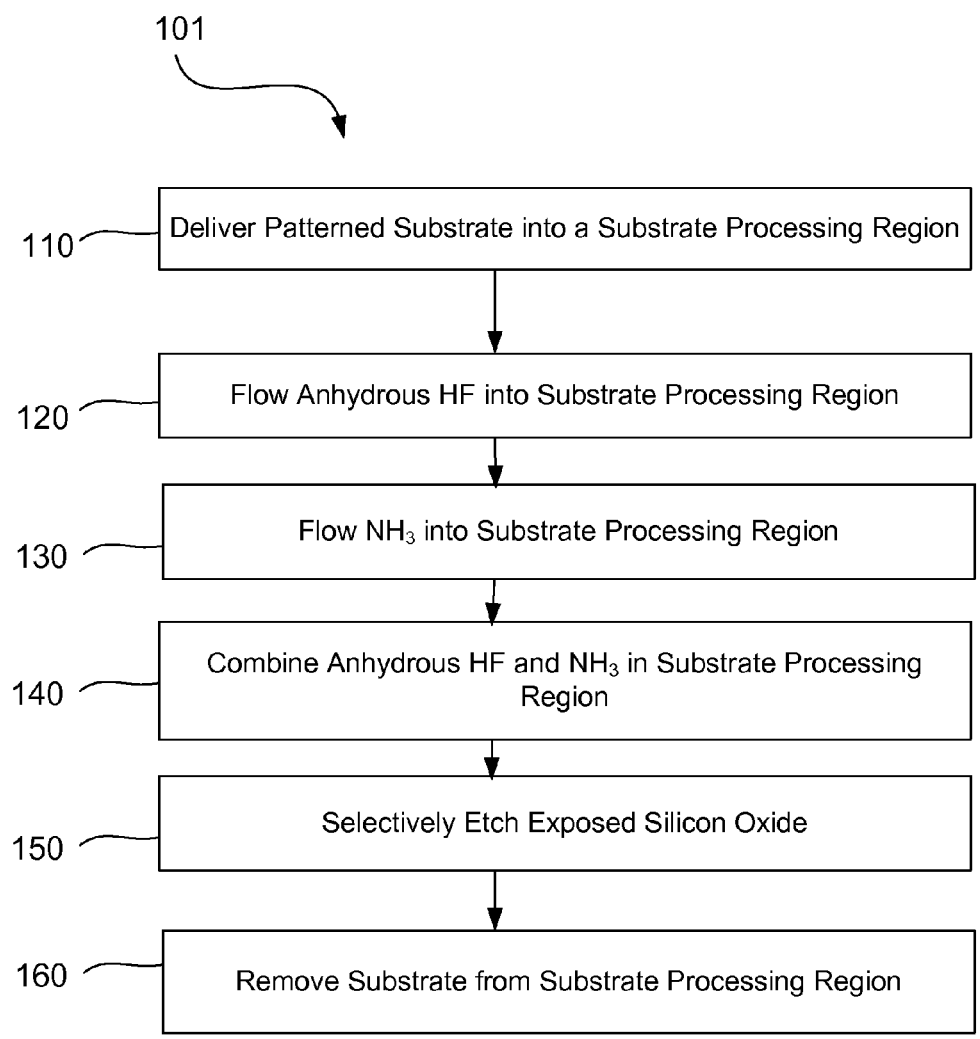
FIG. 1 shows a method of selectively etching silicon oxide according to embodiments.

To better understand and appreciate the embodiments, reference is now made to FIG. 1 which is a flow chart of a silicon oxide selective etch process 101 according to embodiments. Prior to the first operation, a structure is formed in a patterned substrate. The structure possesses exposed portions of silicon oxide and an exposed second portion formed from, e.g. silicon and/or silicon nitride. The substrate is then delivered into a substrate processing region in operation 110.

A flow of anhydrous hydrogen fluoride is initiated into the substrate processing region in operation 120. No plasma is ignited in the substrate processing region or upstream from the substrate processing region in embodiments. The substrate processing region may be referred to as a plasma-free substrate processing region during any or all operations described herein. NH₃ is flowed into the substrate processing region, possibly concurrently, in operation 130. The anhydrous hydrogen fluoride is combined with NH₃ in the plasma-free substrate processing region in operation 140. The NH₃ is not passed through any remote plasma before entering the substrate processing region according to embodiments. Similarly, the anhydrous hydrogen fluoride is not passed through any remote plasma before entering the substrate processing region in embodiments.

The patterned substrate is selectively etched (operation 150) such that the exposed silicon oxide is selectively removed at a higher rate than the exposed second portion. The exposed second portion may comprise or consist of silicon in embodiments. The exposed second portion may comprise or consist of silicon and nitrogen according to embodiments. Process effluents and unreacted reactants are removed from the substrate processing region and then the substrate is removed from the processing region (operation 160).

Silicon oxide selective etch process 101 may be used to remove silicon oxide faster than silicon. The precursor combinations described herein have been found to produce surface-volatile reactants which predominantly etch the silicon oxide and leave silicon essentially alone. As a consequence, essentially no silicon is consumed resulting in extremely high etch selectivities. Silicon nitride may be etched at roughly the rate of the silicon oxide or silicon nitride may be etched at a very low rate. The silicon oxide selectivity relative to silicon nitride is therefore beneficially selectable. Exposed silicon portions and/or exposed silicon nitride portions are also present on the patterned substrate according to embodiments.

The selectivity of etch process 101 (exposed silicon oxide:exposed silicon nitride) may be greater than 75:1, greater than 90:1 or greater than 100:1 in embodiments. The selectivity of etch process 101 (exposed silicon oxide: exposed silicon) may be greater than 130:1, greater than 180:1 or greater than 250:1 according to embodiments. The combination of precursors and other process parameters described herein have been found to make the etch selectivity (exposed silicon oxide:exposed silicon nitride) selectable in the range from less than or about 1:1 to greater than 250:1. Therefore, the etch selectivity of etch process 101 may be less than 40:1, less than 20:1, less than 10:1, less than 5:1 or less than 1:1 in embodiments. No measurable amount of silicon was etched using silicon oxide selective etch process 101 according to embodiments. The exposed portion of silicon has an exposed surface having no native oxide or silicon oxide on the exposed surface in embodiments.

$NH_3$ was used as an example of a second precursor in FIG. 1 and the associated discussion. Generally speaking, the second precursor may comprise or consist of nitrogen and hydrogen. The second precursor may include or more of $N_2H_2$, $N_2H_4$ or $NH_3$ in embodiments. All precursors and processors given throughout the application apply to all embodiments presented herein.

The anhydrous hydrogen fluoride and/or the second precursor may further include one or more relatively inert gases (e.g. He, $N_2$, Ar). Flow rates and ratios of the different gases may be used to control etch rates and etch selectivity. In an embodiment, the anhydrous hydrogen fluoride may be flowed into the substrate processing region at a flow rate of between about 10 sccm (standard cubic centimeters per minute) and 10,000 sccm in embodiments. The second precursor may be flowed into the substrate processing region at a flow rate of between 10 sccm and 5,000 sccm or between 10 mg/m (milligrams per minute) and 5,000 mg/m in embodiments as appropriate. Argon (Ar) and/or Helium (He) may be flowed along with either (or both, separately) precursor at a flow rate of between 0 sccm and 10,000 sccm. One of ordinary skill in the art would recognize that other gases and/or flows may be used depending on a number of factors including processing chamber configuration, substrate size, geometry and layout of features being etched. These process parameters apply to all examples described herein. Additional process parameters will be given following the example of FIG. 2.

Additional precursors may be combined in the substrate processing region through additional entryways or combined with the nitrogen-and-hydrogen-containing precursor prior to entry. Examples of additional precursors include water vapor ($H_2O$) or another precursor which comprises or consists of hydrogen and oxygen in embodiments. The additional precursor may comprise an —OH chemical group according to embodiments, which includes water vapor and alcohols. Examples which do not contain hydrogen or fluorine have also been helpful. The additional precursor may comprise or consist of silicon and fluorine. The additional precursor may include $Si_xF_y$ (for example, $SiF_4$ or $Si_2F_6$). Adding a hydrogen-and-oxygen-containing precursor and/or including a silicon-and-fluorine-containing precursor to the substrate processing region during all etch processes described herein have helped to extend the accessible range of silicon oxide to silicon nitride etch selectivities.

Figure 2:
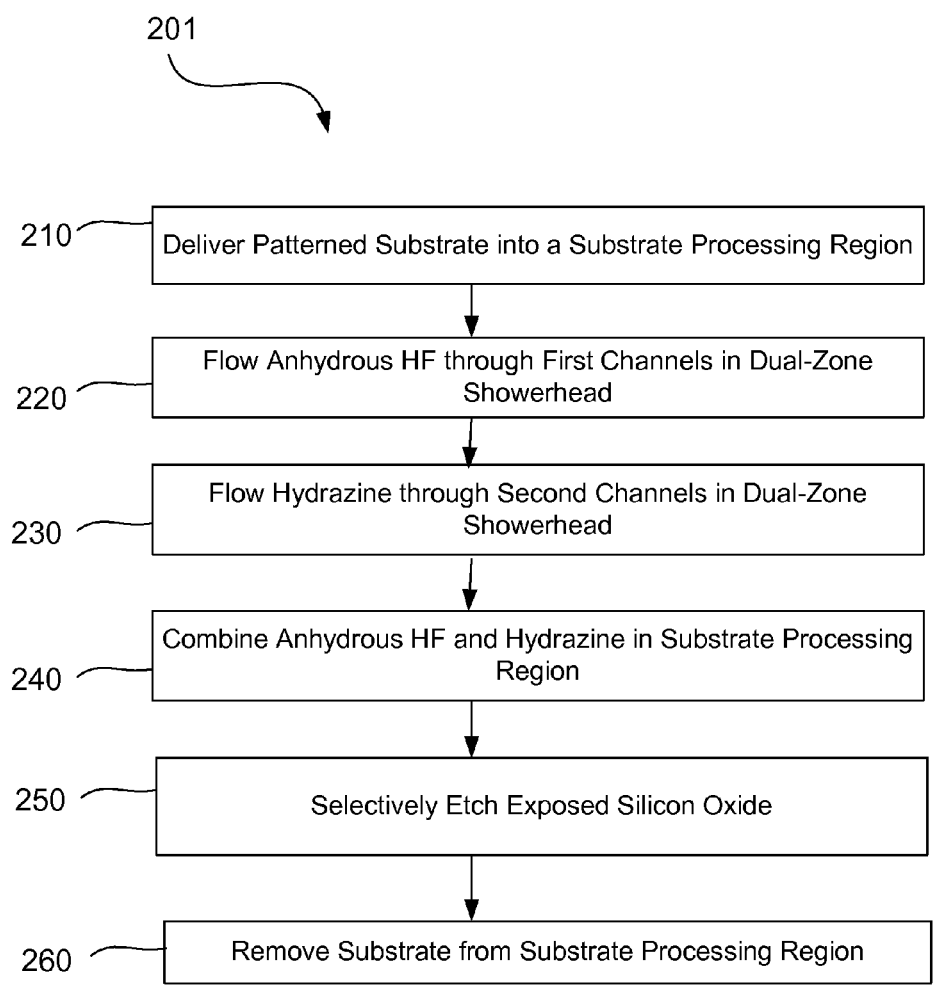
FIG. 2 shows a method of selectively etching silicon oxide according to embodiments.

Reference is now made to FIG. 2 which is a flow chart of a silicon oxide selective etch process 201 according to embodiments. Prior to the first operation, a structure is formed in a patterned substrate. The structure possesses exposed portions of silicon oxide and silicon (e.g. single crystal silicon or polysilicon). The patterned substrate is then delivered into a substrate processing region in operation 210.

A flow of gas-phase HF (e.g. anhydrous HF) is initiated into the substrate processing region through a first channel of a dual-channel showerhead in operation 220. $N_2H_4$ is flowed into the substrate processing region through a second channel of a dual-channel showerhead in operation 230. The first channel and the second channel are separate pathways, in embodiments, and the only path from the second channel to the first channel (or vice versa) is through the substrate processing region. The first channel may comprise through-holes in the dual-channel showerhead and the second channel may comprise blind-holes which open into the substrate processing region but not directly into the region above the dual channel showerhead. The roles may also be reversed, namely, the second channel may comprise through-holes in the dual-channel showerhead and the first channel may comprise blind-holes in embodiments. The gas-phase HF is combined with $N_2H_4$ in the substrate processing region in operation 240. Neither the $N_2H_4$ nor the gas-phase HF are passed through any remote plasma before entering the substrate processing region according to embodiments.

The patterned substrate is selectively etched (operation 250) such that the exposed silicon oxide is selectively removed at a higher rate than the exposed second portion. The substrate processing region may be plasma-free during all operations of selective silicon nitride etch process 201 or during operations 240 and 250 in embodiments. The exposed second portion may comprise, consist essentially of or consist of silicon in embodiments. The exposed second portion may comprise or consist of silicon and nitrogen according to embodiments. Process effluents and unreacted reactants are removed from the substrate processing region and then the substrate is removed from the processing region (operation 260).

During the operation of selectively etching exposed silicon oxide, the pressure in the substrate processing region may be greater than 0.1 Torr, greater than 1 Torr, greater than 10 Torr or greater than 25 Torr according to embodiments. The pressure in the substrate processing region may be less than 1,000 Torr, less than 750 Torr, less than 500 Torr, less than 250 Torr, or less than 100 Torr in embodiments. Upper bounds of all parameters may be combined with lower bounds of the same parameters to form additional embodiments. In a preferred embodiment, the pressure in the substrate processing region during the operation of selectively etching exposed silicon oxide is between 1 Torr and 30 Torr.

During the operation of selectively etching exposed silicon oxide. The temperature of the patterned substrate may be between 0° C. and 400° C., 20° C. and 300° C., 40° C. and 200° C., or between 50° C. and 150° C. in embodiments. The etch rate of silicon oxide is less sensitive to patterned substrate temperature and the silicon etch rate remains essentially zero for all temperature ranges explored and recited herein. On the other hand, the silicon nitride etch rate drops as patterned substrate temperature is raised. The etch selectivity of silicon oxide relative to silicon nitride may be in the higher ranges (e.g. >100:1) for patterned substrate temperatures above 100° C. For patterned substrate temperatures below 40° C., the etch selectivity was observed to drop below 1:1 and plateau at 0.8:1 which allows the benefit of a very broad range of selectable SiO:SiN selectivities.

For patterned substrate temperatures below about 100° C., there may be etch by-products which form on the exposed silicon oxide portions. Therefore, the patterned substrate may be heated above 100° C. to sublimate the etch by-products. Heating the substrate to remove etch by-products may occur between operations 150 and 160 or between 250 and 260 in the examples above. In embodiments, the patterned substrate is heated in the same substrate processing region used for the etching operation to avoid any detrimental chemical alteration to the residual etch by-products. The heating operation may be referred to as an in-situ heating operation or an in-situ anneal to convey that both operations occur in the same substrate processing region, without a need to move the patterned substrate in between. There is a significant cost benefit to performing etching and heating in the same substrate processing region since the throughput is increased due to a reduction in wafer handling (the patterned substrate is not removed from the substrate processing region between etching and heating in embodiments). In combination with the patterned substrate temperatures given previously, the temperature of the patterned substrate may be below 100° C. during the operation of etching the exposed silicon oxide portion and then the temperature of the patterned substrate may be raised above 100° C. to remove etch by-products during the heating operation. A "hot purge" may be used to remove the etch by-products if the temperature of the patterned substrate may be above 100° C. during the etching operation, in which case, the heating operation is optional.

The substrate processing region may be described herein as "plasma-free" during the etch processes described herein. Maintaining a plasma-free substrate processing region and employing the precursors described herein enable the achievement of high etch rate selectivity of silicon oxide relative to silicon and (tunably) silicon nitride. Alternatively, the electron temperature may be less than 0.5 eV, less than 0.45 eV, less than 0.4 eV, or less than 0.35 eV within the substrate processing region during any or all operations described herein according to embodiments. A benefit of the processes described herein include a reduction in plasma damage by using predominantly neutral species to perform the selective silicon oxide etch processes. Conventional plasma etch processes may include sputtering and bombardment components. Another benefit of the processes described herein include a reduction in stress on delicate features on a patterned substrate compared to conventional wet etch processes which can cause bending and peeling of small features as a result of surface tension of liquid etchants.

Exemplary hardware will now be described. FIG. 3A shows a cross-sectional view of an exemplary substrate processing chamber 1001 with a partitioned region within the processing chamber. During film etching, a process gas may be flowed through gas inlet assembly 1005 and into remote region 1015. A cooling plate 1003, faceplate 1017, ion suppressor 1023, showerhead 1025, and a substrate support 1065 (also known as a pedestal), having a substrate 1055 disposed thereon, are shown and may each be included according to embodiments. Pedestal 1065 may have a heat exchange channel through which a heat exchange fluid flows to control the temperature of the substrate. This configuration may allow the substrate 1055 temperature to be cooled or heated to maintain relatively low temperatures, such as between −40° C. to 200° C. Pedestal 1065 may also be resistively heated to relatively high temperatures, such as between 100° C. and 1100° C., using an embedded heater element.

Exemplary configurations may include having the gas inlet assembly 1005 open into a gas supply region 1058 partitioned from the remote region 1015 by faceplate 1017 so that the gases/species flow through the holes in the faceplate 1017 into the remote region 1015. A precursor, for example anhydrous HF, may be flowed into substrate processing region 1033 by embodiments of the showerhead described herein. The precursor may travel from the remote region 1015 through apertures in showerhead 1025 and react with a second precursor flowing into substrate processing region 1033 from a separate portion of the showerhead. The showerhead may be called a dual-channel showerhead as result of the separate channels.

Figure 3B:
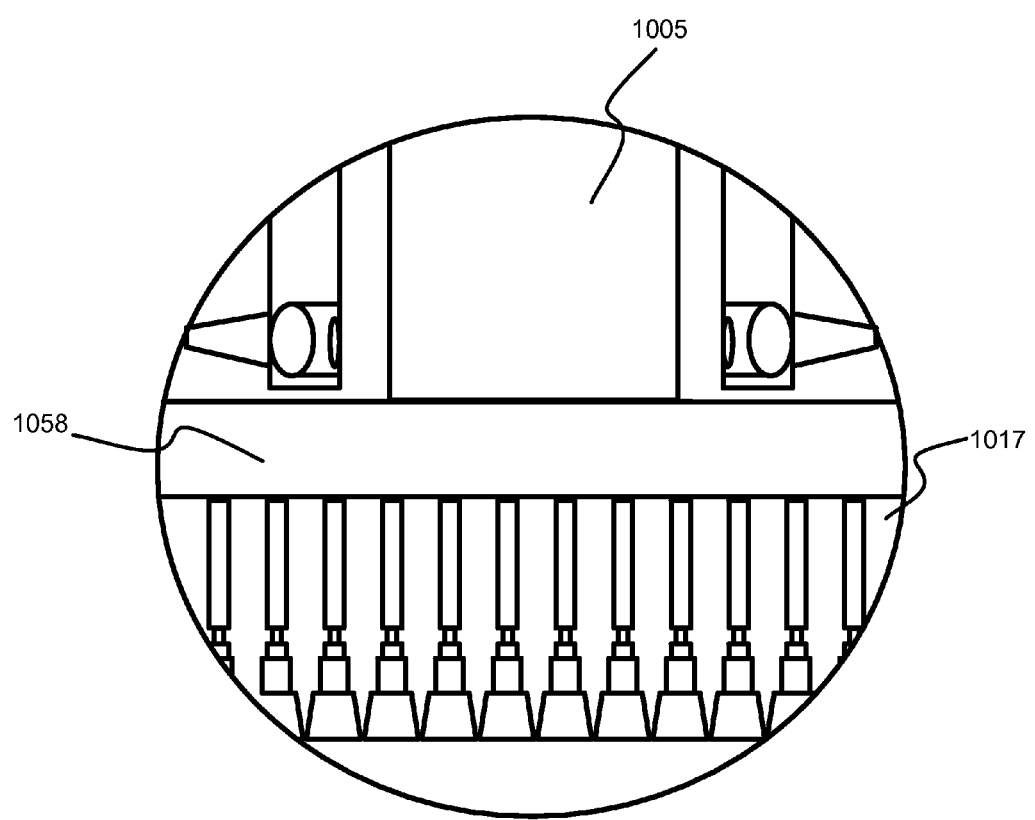
FIG. 3B shows a schematic cross-sectional view of a portion of a substrate processing chamber according to embodiments.

FIG. 3B shows a detailed view of the features affecting the processing gas distribution through faceplate 1017. The gas distribution assemblies such as showerhead 1025 for use in the processing chamber section 1001 may be referred to as dual-channel showerheads (DCSH) and are additionally detailed in the embodiments described in FIG. 3A as well as FIG. 3C herein. The dual channel showerhead may provide for etching processes that allow for separation of etchants outside of the substrate processing region 1033 to provide limited interaction with chamber components and each other prior to being delivered into substrate processing region 1033.

The showerhead 1025 may comprise an upper plate 1014 and a lower plate 1016. The plates may be coupled with one another to define a volume 1018 between the plates. The coupling of the plates may be so as to provide first fluid channels 1019 through the upper and lower plates, and second fluid channels 1021 through the lower plate 1016. The formed channels may be configured to provide fluid access from the volume 1018 through the lower plate 1016 via second fluid channels 1021 alone, and the first fluid channels 1019 may be fluidly isolated from the volume 1018 between the plates and the second fluid channels 1021. The volume 1018 may be fluidly accessible through a side of the gas distribution assembly 1025. Although the exemplary system of FIGS. 3A-3C includes a dual-channel showerhead, it is understood that alternative distribution assemblies may be utilized that maintain first and second precursors fluidly isolated prior to substrate processing region 1033. For example, a perforated plate and tubes underneath the plate may be utilized, although other configurations may operate with reduced efficiency or not provide as uniform processing as the dual-channel showerhead described.

A process gas may flow into remote region 1015 and then through first fluid channels 1019 of showerhead 1025. The process gas may include HF. A plasma may not be generated and may not be present in substrate processing region 1033 during any or all operations presented herein. A plasma may not be generated and may not be present in remote region 1015 during any or all operations presented herein. The two regions may be referred to as plasma-free substrate processing region 1033 and plasma-free remote region 1015. The process gas may also include a carrier gas such as helium, argon, nitrogen ($N_2$), etc. The showerhead may be referred to as a dual-channel showerhead as a result of the two distinct pathways into the substrate processing region. The anhydrous hydrogen fluoride may be flowed through the through-holes in the dual-channel showerhead and the second precursor may pass through separate channels in the dual-channel showerhead. The separate channels may open into the substrate processing region but not into the remote region as described above. Combined flow rates of precursors into the substrate processing region may account for 0.05% to about 20% by volume of the overall gas mixture; the remainder being carrier gases.

Figure 3C:
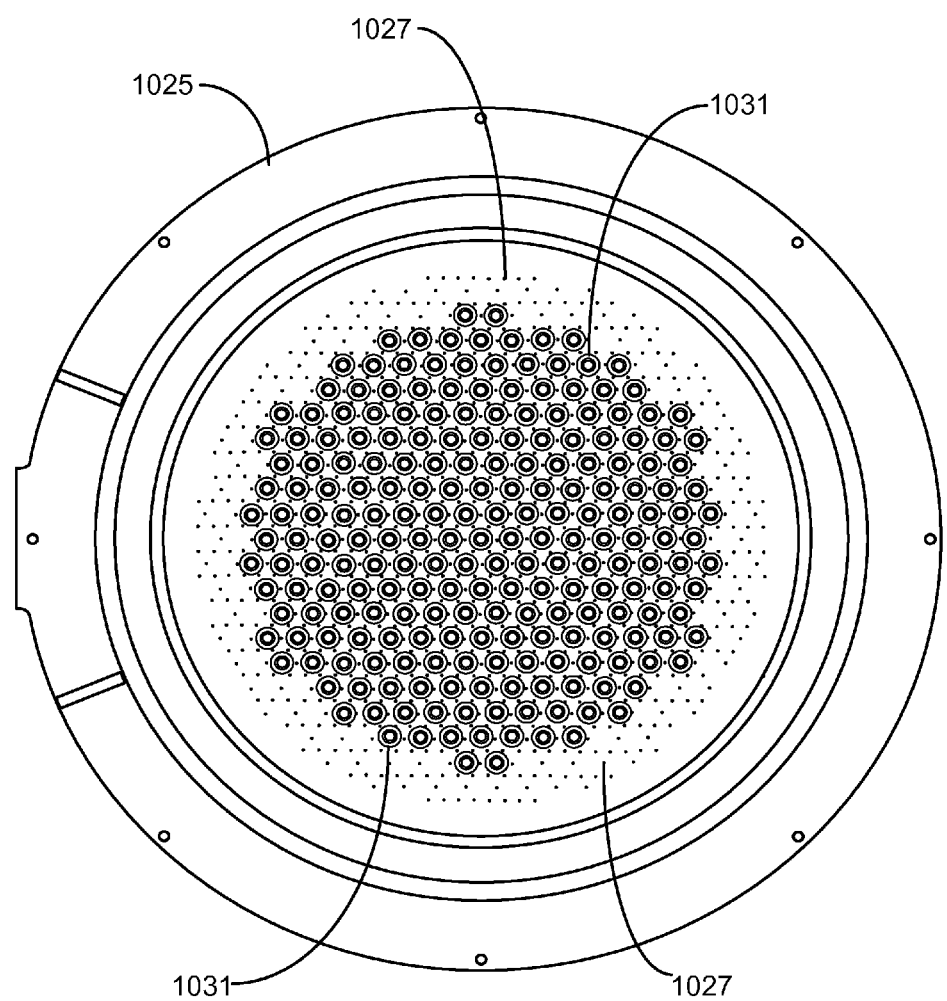
FIG. 3C shows a bottom view of a showerhead according to embodiments.

FIG. 3C is a bottom view of a showerhead 1025 for use with a processing chamber in embodiments. Showerhead 1025 corresponds with the showerhead shown in FIG. 3A. Through-holes 1031, which show a view of first fluid channels 1019, may have a plurality of shapes and configurations to control and affect the flow of precursors through the showerhead 1025. Small holes 1027, which show a view of second fluid channels 1021, may be distributed substantially evenly over the surface of the showerhead, even amongst the through-holes 1031, which may help to provide more even mixing of the precursors as they exit the showerhead than other configurations.

Figure 4:
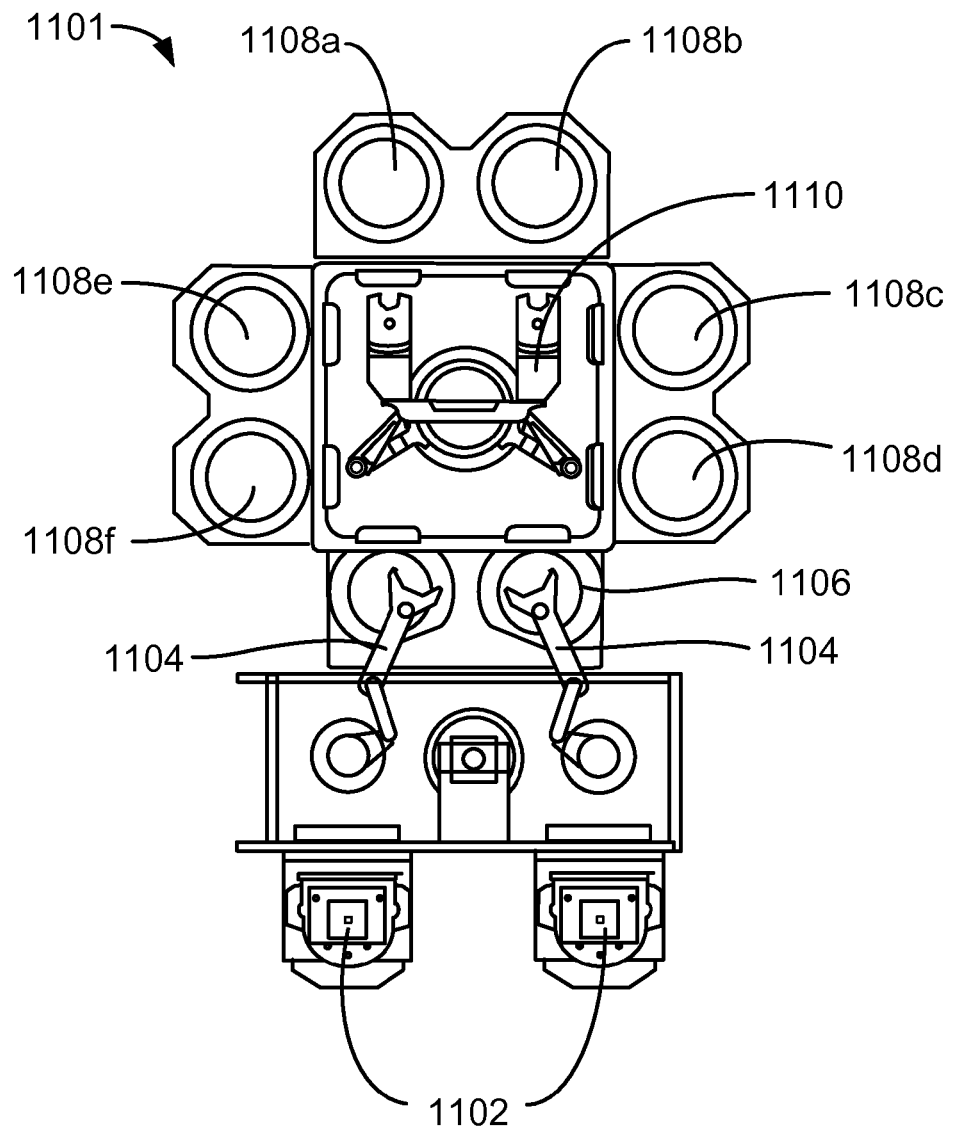
FIG. 4 shows a top view of an exemplary substrate processing system according to embodiments.

Embodiments of the dry etch systems may be incorporated into larger fabrication systems for producing integrated circuit chips. FIG. 4 shows one such processing system (mainframe) 1101 of deposition, etching, baking, and curing chambers in embodiments. In the figure, a pair of front opening unified pods (load lock chambers 1102) supply substrates of a variety of sizes that are received by robotic arms 1104 and placed into a low pressure holding area 1106 before being placed into one of the substrate processing chambers 1108a-f. A second robotic arm 1110 may be used to transport the substrate wafers from the holding area 1106 to the substrate processing chambers 1108a-f and back. Each substrate processing chamber 1108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" of the patterned substrate is predominantly silicon but may include concentrations of other elemental constituents such as, e.g., nitrogen, oxygen, hydrogen and carbon. In some embodiments, silicon portions etched using the methods described herein consist of or consist essentially of silicon. Exposed "silicon oxide" of the patterned substrate is predominantly $SiO_2$ but may include concentrations of other elemental constituents such as, e.g., nitrogen, hydrogen and carbon. In some embodiments, silicon oxide portions described herein consist of or consist essentially of silicon and oxygen. Exposed "silicon nitride" of the patterned substrate is predominantly $Si_3N_4$ but may include concentrations of other elemental constituents such as, e.g., oxygen, hydrogen and carbon. In some embodiments, silicon nitride portions described herein consist of or consist essentially of silicon and nitrogen.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap. A trench may be in the shape of a moat around an island of material whose aspect ratio is the length or circumference of the moat divided by the width of the moat. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

The term "precursor" is used to refer to any process gas which takes part in a reaction to either remove material from or deposit material onto a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:
1. A method of etching a patterned substrate, the method comprising:
   placing the patterned substrate in a substrate processing region of a substrate processing chamber, wherein the patterned substrate has an exposed silicon oxide portion and an exposed silicon nitride portion;
   flowing anhydrous hydrogen fluoride into the substrate processing region through a first channel comprising holes which open into the substrate processing region but not directly into the remote region;
   flowing a nitrogen-and-hydrogen-containing precursor into a remote region fluidly coupled to the substrate processing region through a dual-channel showerhead, wherein the nitrogen-and-hydrogen-containing precursor flows from the remote region to the substrate processing region through a second channel comprising through-holes through the dual-channel showerhead;
   combining the anhydrous hydrogen fluoride with the nitrogen-and-hydrogen-containing precursor within the substrate processing region, wherein the anhydrous hydrogen fluoride and the nitrogen-and-hydrogen-containing precursor do not encounter each other until after passing into the substrate processing region;
   dry etching the exposed silicon oxide portion, wherein a selectivity of the dry etching operation (exposed silicon oxide:exposed silicon nitride) is selectable throughout the range from 1:1 through 250:1.

2. The method of claim 1 wherein the exposed silicon nitride portion consists essentially of silicon and nitrogen.

3. The method of claim 1 wherein the exposed silicon oxide portion consists essentially of silicon and oxygen.

4. The method of claim 1 wherein the patterned substrate further comprises an exposed silicon portion comprising one of single-crystal silicon, polysilicon or amorphous silicon.

5. The method of claim 1, wherein the exposed silicon oxide portion is removed at a silicon oxide etch rate which is greater than a silicon nitride etch rate at which the exposed silicon nitride portion is removed.

6. The method of claim 1 wherein the substrate processing region is plasma-free during the operation of dry-etching the exposed silicon oxide portion.

7. The method of claim 1 wherein the anhydrous hydrogen fluoride is not excited in any plasma prior to entering the substrate processing region.

8. A method of etching a patterned substrate, the method comprising:
    placing the patterned substrate in a substrate processing region of a substrate processing chamber, wherein the patterned substrate has exposed silicon oxide and one of exposed silicon or exposed silicon nitride;
    flowing dry HF vapor into a remote region fluidly coupled to the substrate processing region through a dual-channel showerhead, wherein the remote region is devoid of any nitrogen-and-hydrogen-containing precursor and the dry HF vapor flows from the remote region to the substrate processing region through a first channel comprising through-holes through the dual-channel showerhead;
    flowing a nitrogen-and-hydrogen-containing precursor into the substrate processing region through a second channel comprising holes which open into the substrate processing region but not directly into the remote region;
    combining the dry HF vapor with the nitrogen-and-hydrogen-containing precursor in the substrate processing region; and
    etching the exposed silicon oxide more rapidly than the one of exposed silicon or exposed silicon nitride.

9. The method of claim 8 wherein a selectivity of the operation (exposed silicon oxide: one of exposed silicon or exposed silicon nitride) is greater than or about 75:1.

10. The method of claim 8 wherein neither the HF vapor nor the nitrogen-and-hydrogen-containing precursor flow through any plasma prior to entering the substrate processing region.

11. The method of claim 8 wherein the nitrogen-and-hydrogen-containing precursor comprises one of $N_2H_2$, $NH_3$, or $N_2H_4$.

12. The method of claim 8 wherein the nitrogen-and-hydrogen-containing precursor consists only of nitrogen and hydrogen.

13. The method of claim 8 wherein a temperature of the patterned substrate is between 40° C. and about 200° C. during the operation of etching the exposed silicon oxide.

14. A method of etching a patterned substrate, the method comprising:
    placing the patterned substrate in a substrate processing region of a substrate processing chamber, wherein the patterned substrate has an exposed silicon oxide portion and an exposed silicon portion;
    flowing anhydrous HF into the substrate processing region through a first channel of a dual-channel showerhead;
    flowing $NH_3$ into the substrate processing region without first passing the $NH_3$ through any plasma through a second channel of a dual channel showerhead;
    combining the anhydrous HF and the $NH_3$ in the substrate processing region, wherein the anhydrous HF and $NH_3$ do not mix until each of the anhydrous HF and $NH_3$ have passed into the substrate processing region, wherein the anhydrous HF is not combined with any nitrogen-and-hydrogen-containing precursor prior to entering the substrate processing region;
    etching the exposed silicon oxide portion, wherein the substrate processing region is plasma-free during the operation of etching the exposed silicon oxide portion, wherein a temperature of the patterned substrate is below 100° C. during the operation of etching the exposed silicon oxide portion; and
    heating the patterned substrate above 100° C. to remove etch by-products, wherein the patterned substrate is not removed from the substrate processing region between etching the exposed silicon oxide portion and heating the patterned substrate.

15. The method of claim 14 wherein a pressure in the substrate processing region is between 0.1 Torr and 1000 Torr during the operation of etching the exposed silicon oxide portion.

* * * * *